United States Patent
Kim

(10) Patent No.: US 9,893,095 B2
(45) Date of Patent: Feb. 13, 2018

(54) LIQUID CRYSTAL DISPLAY DEVICE HAVING REDUCED DISPLAY DEFECTS AND IMPROVED APERTURE RATIO AND MANUFACTURING METHOD THEREFOR

(71) Applicant: Samsung Display Co., Ltd., Yongin-si, Gyeonggi-do (KR)

(72) Inventor: Duk-Sung Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 116 days.

(21) Appl. No.: 14/879,426

(22) Filed: Oct. 9, 2015

(65) Prior Publication Data

US 2016/0216571 A1   Jul. 28, 2016

(30) Foreign Application Priority Data

Jan. 23, 2015  (KR) .................. 10-2015-0011564

(51) Int. Cl.
*H01L 27/12*   (2006.01)
*G02F 1/1362*   (2006.01)

(52) U.S. Cl.
CPC .... *H01L 27/1262* (2013.01); *G02F 1/136213* (2013.01); *G02F 1/136286* (2013.01); *G02F 2001/136272* (2013.01)

(58) Field of Classification Search
CPC ................. G02F 1/136213; H01L 27/1262
See application file for complete search history.

(56) References Cited

U.S. PATENT DOCUMENTS

| | | | | |
|---|---|---|---|---|
| 6,104,450 A | * | 8/2000 | Hiraishi | G02F 1/136213 349/48 |
| 6,414,729 B1 | * | 7/2002 | Akiyama | G02F 1/13475 257/E27.111 |
| 6,885,110 B1 | * | 4/2005 | Ogawa | G02F 1/136286 174/255 |
| 2002/0149729 A1 | * | 10/2002 | Nishimura | G02F 1/134363 349/141 |
| 2010/0039419 A1 | * | 2/2010 | Yoshiga | G09G 3/3696 345/211 |
| 2010/0195038 A1 | * | 8/2010 | Ohta | G02F 1/134363 349/147 |
| 2011/0006975 A1 | * | 1/2011 | Nagashima | G02F 1/1362 345/92 |

(Continued)

FOREIGN PATENT DOCUMENTS

| | | | | |
|---|---|---|---|---|
| KR | 10-2005-0003249 | * | 1/2005 | ............. G02F 1/136 |
| KR | 10-2006-0125137 A | | 12/2006 | |

(Continued)

*Primary Examiner* — Sang V Nguyen
(74) *Attorney, Agent, or Firm* — Innovation Counsel LLP

(57) ABSTRACT

A liquid crystal display according to an embodiment of the present invention includes: a first substrate; a pixel electrode formed on the first substrate; a first insulating layer formed on at least part of the pixel electrode; a sustain electrode line formed on the first insulating layer and over at least a portion of the pixel electrode so as to form a capacitance; a second insulating layer formed on the sustain electrode line; and a data line formed on the second insulating layer, the data line and sustain electrode line positioned so that the sustain electrode line is positioned between the data line and the pixel electrode.

8 Claims, 18 Drawing Sheets

(56) References Cited

U.S. PATENT DOCUMENTS

| | | | |
|---|---|---|---|
| 2011/0042668 A1* | 2/2011 | Hama | H01L 29/7869 257/43 |
| 2012/0187404 A1* | 7/2012 | Seong | H01L 27/124 257/59 |
| 2013/0161625 A1* | 6/2013 | Ku | H01L 27/1288 257/59 |
| 2015/0042914 A1* | 2/2015 | Cho | G02F 1/136286 349/43 |
| 2016/0027820 A1* | 1/2016 | Liu | H01L 27/1225 257/43 |
| 2016/0111442 A1* | 4/2016 | Wu | H01L 27/124 257/72 |

FOREIGN PATENT DOCUMENTS

| | | | | |
|---|---|---|---|---|
| KR | 10-0710532 B1 | | 4/2007 | |
| KR | 10-0975319 B1 | | 8/2010 | |
| KR | 10-2011-0130854 | * | 12/2011 | ............ G02F 1/136 |
| KR | 10-2011-0130854 A | | 12/2011 | |
| KR | 10-2014-0046239 A | | 4/2014 | |

* cited by examiner

LIQUID CRYSTAL DISPLAY DEVICE HAVING REDUCED DISPLAY DEFECTS AND IMPROVED APERTURE RATIO AND MANUFACTURING METHOD THEREFOR

CROSS-REFERENCE TO RELATED APPLICATION

This application claims priority to, and the benefit of, Korean Patent Application No. 10-2015-0011564 filed in the Korean Intellectual Property Office on Jan. 23, 2015, the entire contents of which are incorporated herein by reference.

BACKGROUND OF THE INVENTION (a) Field of the Invention

Embodiments of the present invention relates to flat panel displays. More specifically, embodiments of the present invention relate to liquid crystal displays having reduced display defects and improved aperture ratio, and their methods of manufacture.

(b) Description of the Related Art

A liquid crystal display, which is one of the most widely used flat panel displays, is a display device that includes two sheets of substrates on which electrodes are formed, with a liquid crystal layer interposed therebetween. The liquid crystal display adjusts an amount of transmitted light by applying a voltage to the electrodes to rearrange liquid crystal molecules of a liquid crystal layer.

One commonly implemented liquid crystal display configuration employs a structure in which the electric field generating electrodes are each formed on different substrates. Among these, a structure is mainly used in which a plurality of thin film transistors and pixel electrodes are arranged in a matrix form on the first substrate (hereinafter, referred to as a lower panel or a thin film transistor display panel) and red, green, and blue color filters are formed on the second substrate (hereinafter, referred to as an upper panel or a common electrode display panel), where front surfaces of the color filters are covered by the common electrode.

FIG. 3 is a cross-sectional view of a conventional liquid crystal display.

Referring to FIG. 3, pixel electrodes 1100 are formed at both sides of a data line 1300.

The pixel electrodes 1100 connected to a drain electrode of a thin film transistor may maintain an electric field with a common electrode 1810, by forming a capacitance with a sustain electrode line 1200. Therefore, in order to form the capacitance, the sustain electrode line 1200 and the pixel electrodes 110 need to overlap each other by a predetermined interval 2200.

However, if the interval 2100 between the data line 1300 and the pixel electrodes 1100 is narrow, undesirable capacitance is also formed between the data line 1300 and the pixel electrodes 1100, thereby causing a phenomenon in which a signal of the data line 1300 is delayed. This may manifest as a display defect visible to the user.

Therefore, since sufficient intervals 2100 and 2200 need to be maintained, corresponding light blocking areas created by a light blocking member 1820 are increased and a display area 2300 is decreased, thereby making it difficult to secure a high aperture ratio.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments of the present invention provide a liquid crystal display and a manufacturing method therefor having the advantages of avoiding display defects and increasing aperture ratio.

An exemplary embodiment of the present invention provides a liquid crystal display including: a first substrate; a pixel electrode formed on the first substrate; a first insulating layer formed on at least part of the pixel electrode; a sustain electrode line formed on the first insulating layer and over at least a portion of the pixel electrode so as to form a capacitance; a second insulating layer formed on the sustain electrode line; and a data line formed on the second insulating layer, the data line and sustain electrode line positioned so that the sustain electrode line is positioned between the data line and the pixel electrode.

The liquid crystal display may further include: a second substrate disposed so as to face the first substrate; a common electrode formed on the second substrate; and a liquid crystal layer interposed between the common electrode and the pixel electrode.

The liquid crystal display may further include a gate line formed on a same layer as the sustain electrode line.

The sustain electrode line and the gate line may further include a corrosion prevention electrode formed thereon.

Another embodiment of the present invention provides a method of manufacturing a liquid crystal display including: forming a pixel electrode on a first substrate; forming a first insulating layer on the pixel electrode; forming a sustain electrode line and a gate line on the first insulating layer; forming a second insulating layer on the sustain electrode line and the gate line; forming a semiconductor layer on the second insulating layer; etching parts of the semiconductor layer, the second insulating layer, and the first insulating layer so that a part of the pixel electrode is exposed; and forming a source electrode, a drain electrode, and a data line by depositing a conductive material on the second insulating layer and subsequently etching the conductive material.

The part of the pixel electrode may be a part corresponding to a display area of the pixel electrode.

The part of the pixel electrode may contact the drain electrode of the pixel electrode.

The method may further include: forming a third insulating layer, wherein in the forming a third insulating layer, the second insulating layer may be etched in an area corresponding to a display area of the pixel electrode.

The method may further include, after the forming a semiconductor layer, forming an ohmic contact.

The manufacturing method may further include forming a third insulating layer, wherein the forming of a pixel electrode includes forming the pixel electrode using a first mask, wherein the forming a sustain electrode line and a gate line is performed using a second mask, wherein the etching parts of the semiconductor layer, the second insulating layer, and the first insulating layer is performed so as to expose the part of the pixel electrode using a third mask, wherein the forming a source electrode, a drain electrode, and a data line is performed using a fourth mask, and wherein the forming a third insulating layer is performed using a fifth mask.

The third mask may be a two-tone mask.

The fourth mask may be a two-tone mask.

According to an embodiment of the present invention, a liquid crystal display may have fewer display defects while also having a higher aperture ratio.

DETAILED DESCRIPTION OF THE EMBODIMENTS

Figure 1:
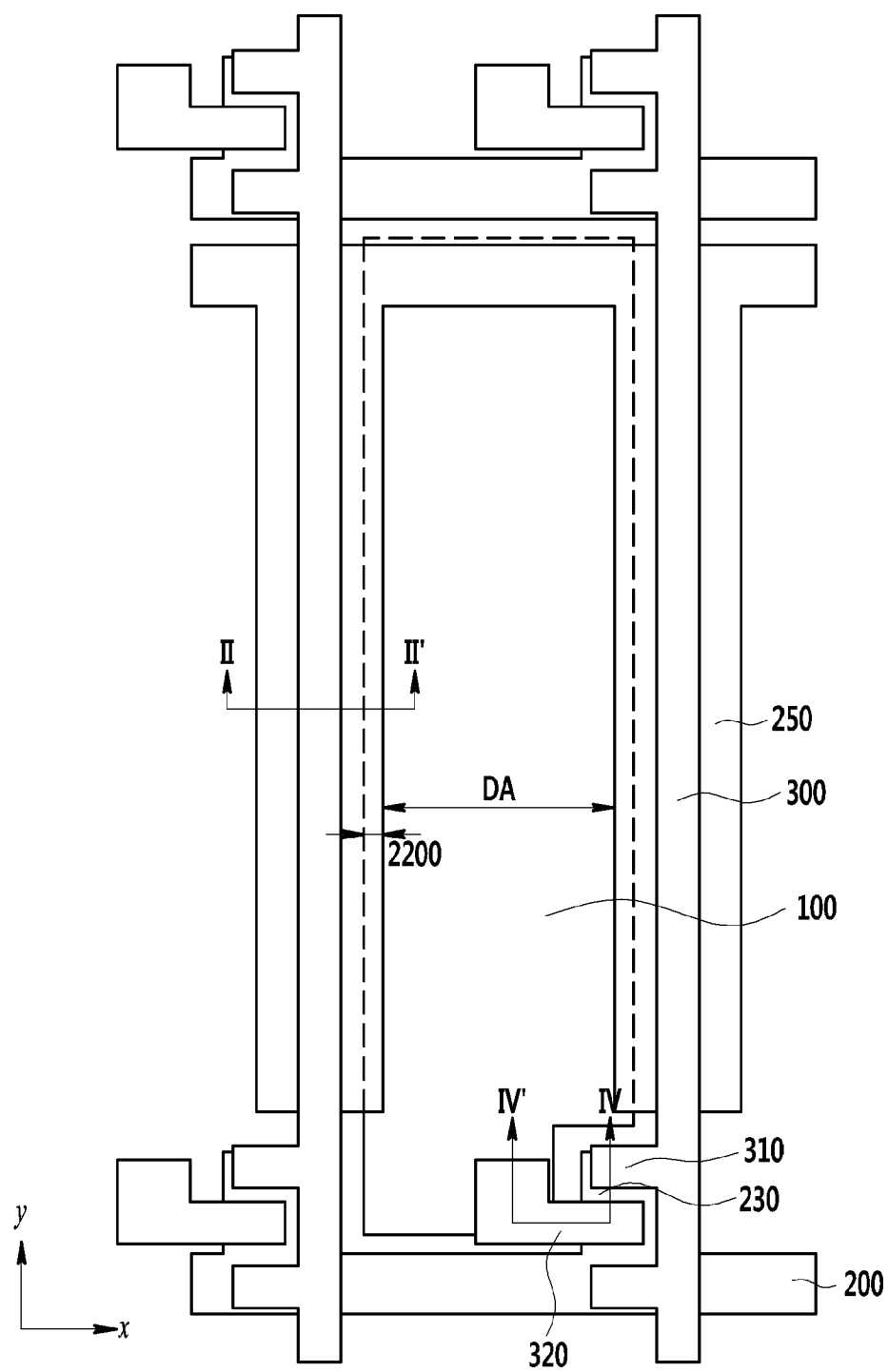
FIG. 1 is a view showing a pixel area of a liquid crystal display according to an exemplary embodiment of the present invention.

In the following detailed description, the present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc., are exaggerated for clarity. The various Figures are thus not to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. All numerical values are approximate, and may vary. All examples of specific materials and compositions are to be taken as nonlimiting and exemplary only. Other suitable materials and compositions may be used instead.

Figure 2:
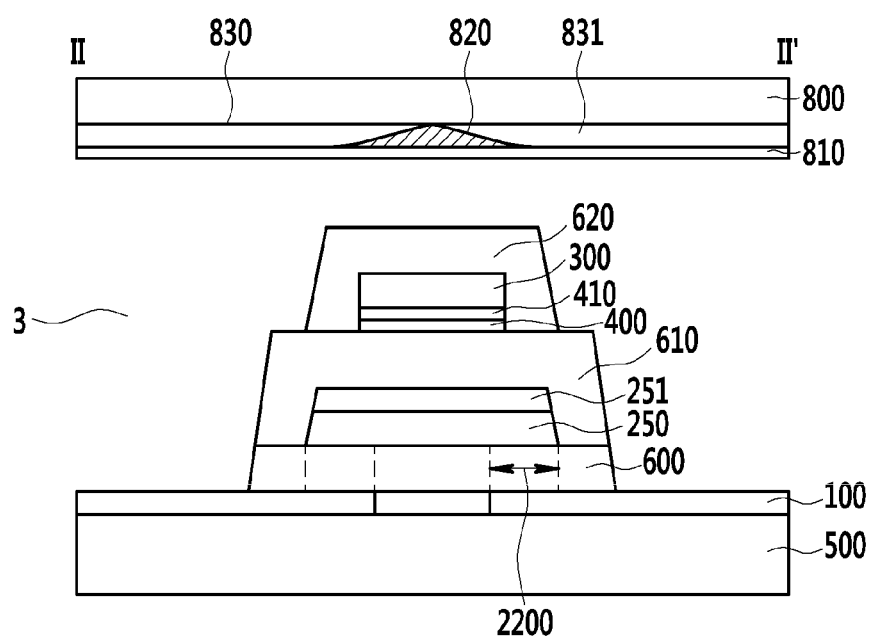
FIG. 2 is a cross-sectional view taken along line II-II' of FIG. 1.
Figure 4A:
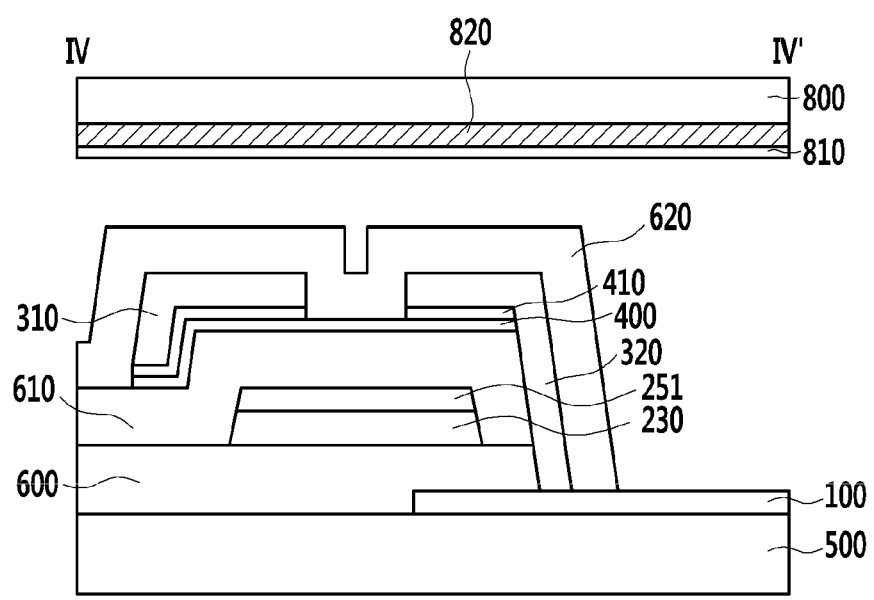
FIGS. 4A and 4B illustrate different embodiments of cross-sectional views taken along line IV-IV' of FIG. 1.
Figure 4B:
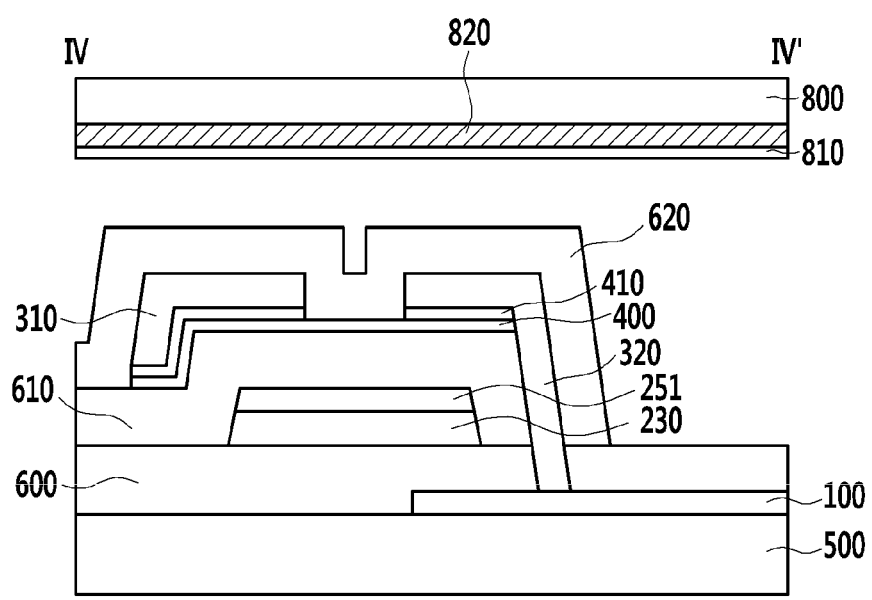

FIG. 1 is a view showing a pixel area of a liquid crystal display according to an exemplary embodiment of the present invention. FIG. 2 is a cross-sectional view taken along line II-II' and FIGS. 4A-4B are cross-sectional views of two different embodiments of the display of FIG. 1, taken along line IV-IV'. FIGS. 4A and 4B differ in the presence/absence of a first insulating layer 600 on a display area DA of a pixel electrode 100. The display area DA refers to those regions of pixel electrode 100 that do not overlap an electrode (e.g., the sustain electrode line 250) having low light transmittance. Hereinafter, unless particularly stated, a case in which the first insulating layer 600 is not present on the display area DA will be described with reference to FIG. 4A, for convenience of explanation.

Referring to FIGS. 1, 2 and 4A, the liquid crystal display according to an exemplary embodiment of the present invention includes a first substrate 500, a pixel electrode 100, a first insulating layer 600, a sustain electrode line 250, a gate line 200, a second insulating layer 610, a semiconductor 400, a data line 300, and a third insulating layer 620 in a lower display panel.

The liquid crystal display according to an exemplary embodiment of the present invention also includes a second substrate 800, color filters 830 and 831, a light blocking member 820, and a common electrode 810 in an upper display panel.

The color filters 830 and 831 and the light blocking member 820 may alternatively be formed in the lower display panel in order to solve an alignment problem depending on the liquid crystal display.

The color filters 830 and 831 may each be formed to have a single color from among the primary colors red, green and blue, but are not limited thereto. For example, the color filers 830 and 831 may be formed to have one or more of cyan, magenta, yellow, and white.

The light blocking member 820 may also be referred to as a black matrix. The light blocking member 820 may be formed substantially simultaneously with a column spacer using one mask. This mask, which is a two-tone mask, may alternatively be a half-tone mask or a slit mask.

The light blocking member 820 may also be formed of a metal such as chromium (Cr), or the like.

The lower display panel and the upper display panel are assembled by interposing a column spacer and a seal therebetween so that the first substrate 500 and the second substrate 800 face each other, whereupon a liquid crystal is injected therebetween, thereby forming a liquid crystal layer 3.

The liquid crystal layer 3 is oriented according to an electric field between the pixel electrode 100 and the common electrode 810, so as to pass or block light emitted from a backlight unit (not shown) depending on a grayscale.

Hereinafter, a case in which the liquid crystal display according to an exemplary embodiment of the present invention has structures corresponding to a normally white mode and a twisted nematic (TN) mode will be described for convenience of explanation.

However, as described below, in the case in which the liquid crystal display has a structure in which the pixel electrode 100 is formed on a lowest layer among the electrodes formed in the lower display panel, and the pixel electrode 100 forms a capacitance with the sustain electrode line 250, the liquid crystal display may also employ an in plane switching (IPS) mode, a fringe field switching (FFS) mode, or the like depending on an arrangement of the common electrode 810 as well as a vertical alignment (VA) mode.

When the liquid crystals of the liquid crystal layer 3 do not have an electric field applied thereto, long axes thereof are oriented substantially parallel to the first substrate 500 or the second substrate 800 and are in a twisted state so as to be oriented 90° relative to each other in the vicinity of the first substrate 500 and the second substrate 800.

Although not shown, first and second polarizing plates having polarization axes which are perpendicular to each other are each disposed below the lower display panel and on the upper display panel.

Therefore, in a voltage off state, white light from the backlight unit is rotated 90 degrees depending on optical anisotropy of the liquid crystal, so as to be emitted to the outside.

In a voltage on state, since the liquid crystal is arranged so that the long axis thereof is perpendicular to the lower display panel or the upper display panel, the light from the backlight unit does not pass the second polarizing plate, such that a black grayscale is displayed.

The first substrate 500 and the second substrate 800 are made of an insulating material and may be made of glass or plastic, such as polyimide or the like.

The pixel electrode 100 is formed on the first substrate 500. According to embodiments of the present invention, the pixel electrode 100 is formed on the lowest layer among all electrodes of the lower display panel.

The pixel electrode 100 according to the present embodiment is formed as one electrode, but may alternatively be formed so as to be divided into a high electrode and a low electrode to which different voltages are applied in order to improve visibility. In this alternate case, separate thin film transistors may be required.

A first insulating layer 600 is formed on the pixel electrode 100. The first insulating layer 600 may be made of an inorganic insulating material such as silicon nitride (SiNx), silicon oxide (SiOx), or the like. The first insulating layer 600 may be dielectric.

A sustain electrode line 250 and a gate line 200 are formed on the first insulating layer 600. The sustain electrode line 250 and the gate line 200 may be formed of the same conductive material. The sustain electrode line 250 and the gate line 200 may be configured of a single material such as aluminum (Al), molybdenum (Mo), copper (Cu), or the like, a synthetic material, a stacked structure having multiple layers of material(s), or the like.

According to another exemplary embodiment of the present invention, the sustain electrode line 250 and the gate line 200 may further include a corrosion prevention electrode 251 formed thereon. This is to prevent corrosion of the gate line 200 exposed from a gate line pad part to be described below in connection with FIG. 6A. The corrosion prevention electrode 251 may be configured of a transparent conductive oxide (TCO). That is, the sustain electrode line 250 and the gate line 200 may be formed in a double wiring including the transparent conductive oxide.

The sustain electrode line 250 is formed so as to overlap a boundary area of the pixel electrode 100. The sustain electrode line 250 and the pixel electrode 100 together form a capacitance. The capacitance may be determined according to the area of overlap, and a thickness of the first insulating layer 600.

The area of overlap between the sustain electrode line 250 and the pixel electrode 100 may be reduced by narrowing the first insulating layer 600, which has the advantage of increasing or widening display area DA of the pixel electrode 100.

The gate line 200 is formed so as to extend substantially in a horizontal direction x in a gate area in which the thin film transistor is formed. The gate line 200 has a protrusion part 230 in an area in which the thin film transistor is to be formed.

Although the protrusion part 230 is shown as partially overlapping the pixel electrode 100 in a vertical direction in FIGS. 4A, 4B, 7B, 8B, and 9B, it is often preferable that the protrusion part 230 and the pixel electrode 100 are formed so as not to overlap each other in the vertical direction. In some applications, it may not be desirable to have the gate line 200 (including the protrusion part 230) form a capacitance with the pixel electrode 100. Embodiments of the invention contemplate structures in which such a capacitance is, and is not, formed.

A second insulating layer 610 is formed on the sustain electrode line 250 and the gate line 200. The second insulating layer 610 may be made of an inorganic insulating material such as silicon nitride (SiNx), silicon oxide (SiOx), or the like.

A semiconductor 400 is formed on the second insulating layer 610. The semiconductor 400 may be made of an amorphous silicon, a polycrystalline silicon, a metal oxide, or the like.

An ohmic contact 410 is formed on the semiconductor 400. The ohmic contact 410 may be made of silicide or a material such as n+ hydrogenated amorphous silicon which is heavily doped with n-type impurities.

In the case in which the semiconductor 400 is an oxide semiconductor, the ohmic contact 410 may be omitted.

A data line 300, a source electrode 310, and a drain electrode 320 are formed on the semiconductor 400. The data line 300, the source electrode 310, and the drain electrode 320 may be formed of the same conductive material. The data line 300, the source electrode 310, and the drain electrode 320 may be configured of a single material such as aluminum (Al), molybdenum (Mo), copper (Cu), or the like, a synthetic material, a stacked structure with multiple layers, or the like.

According to another exemplary embodiment of the present invention, the data line 300, the source electrode 310, and the drain electrode 320 may further include a corrosion prevention electrode 315 formed thereon. This is to prevent corrosion of the data line 300 exposed from a data line pad part to be described below in FIG. 6B. The corrosion prevention electrode 315 may be configured of a transparent conductive oxide (TCO).

The data line 300 may be formed so as to extend generally in a vertical direction y between two adjacent pixel electrodes 100. As described above, in order to prevent signal delay in the data line 300, it is preferable that the capacitance is not formed between the data line 300 and the pixel electrode 100. Since the data line 300 is formed on the sustain electrode line 250, the formation of capacitance with the pixel electrode is blocked.

Figure 3:
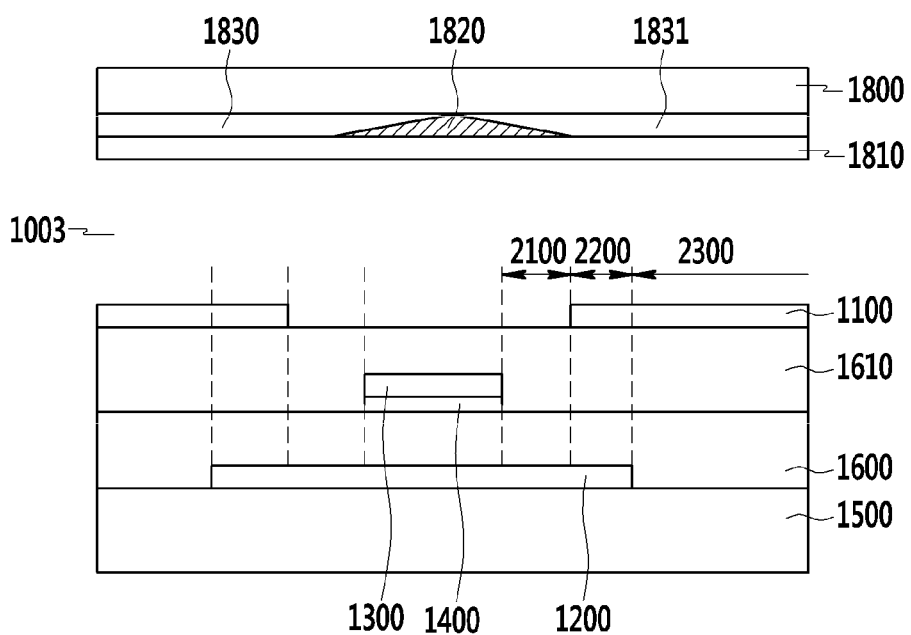
FIG. 3 is a partial cross-sectional view of a conventional liquid crystal display.

The interval 2100 and the interval 2200 are required in FIG. 3 as described above, but in the exemplary embodiment of the present invention of FIG. 2, since the sustain electrode line 250 and the pixel electrode 100 overlap each other, only the interval 2200 in which the capacitance is to be formed is of interest, and there is no need to consider the interval between the data line 300 and the pixel electrode 100.

Therefore, the display area DA of the pixel electrode 100 is larger than that of the conventional art, thus increasing aperture ratio.

The data line 300 extends close to the thin film transistor in the gate area, thereby having the source electrode 310 formed thereon. The drain electrode 320 is also formed by an etching or a separate deposition.

The names of the source electrode 310 and the drain electrode 320 corresponding to the respective electrodes of the thin film transistor may be exchanged depending on whether the thin film transistor is an N type or a P type.

The drain electrode 320 is formed so as to be directly in contact with the pixel electrode 100.

According to the related art of FIG. 3, since the pixel electrode 1100 is generally formed on the uppermost layer of the first substrate 1500, the pixel electrode 1100 needs to be electrically connected to the drain electrode by forming an opening in the passivation layer. In this case, since the formed opening is typically made in a non-display area, it increases aperture ratio.

According to embodiments of the present invention, since the drain electrode 320 and the pixel electrode 100 are in direct contact with each other, the above-mentioned opening part is not required, thereby making it possible to promote improvement of an aperture ratio.

The third insulating layer 620 is formed on the data line 300, the source electrode 310, and the drain electrode 320. The third insulating layer 620 may be made of an inorganic insulating material such as silicon nitride (SiNx), silicon oxide (SiOx), or the like. The third insulating layer 620 may be the passivation layer.

Figure 5:
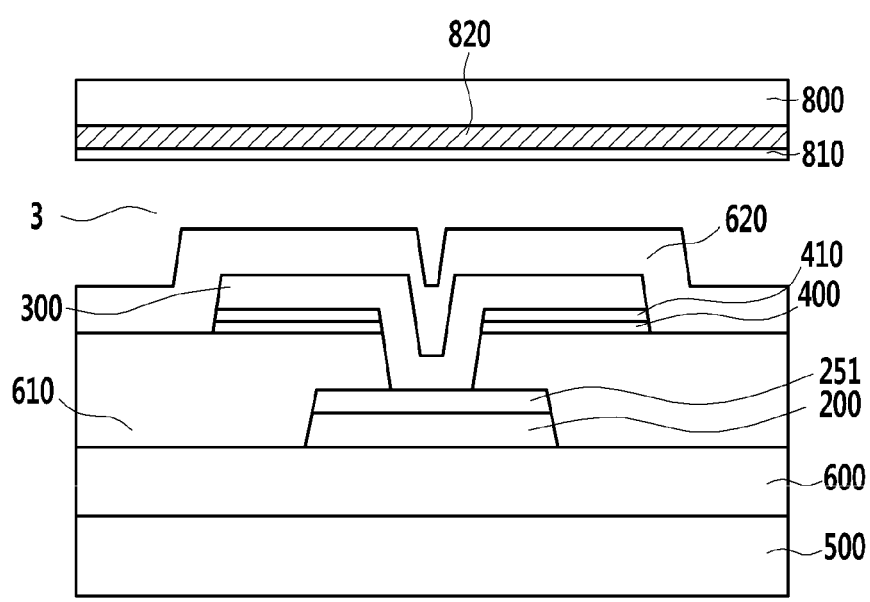
FIG. 5 is a cross-sectional view of a partial contact area of the liquid crystal display according to an exemplary embodiment of the present invention.

FIG. 5 is a view showing a partial contact area of a liquid crystal display according to an exemplary embodiment of the present invention.

Referring to FIG. 5, the gate line 200 and the data line 300 are directly connected to each other through a contact hole.

The above-mentioned configuration may be called a bride contact and may be formed in an amorphous silicon gate (ASG). The ASG means a gate driving circuit using an amorphous silicon transistor.

Figure 6A:
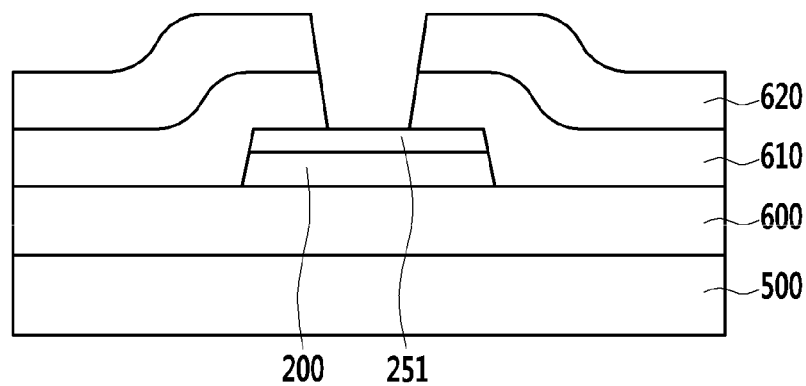
FIGS. 6A and 6B illustrate a gate line pad part and a data line pad part, respectively.
Figure 6B:
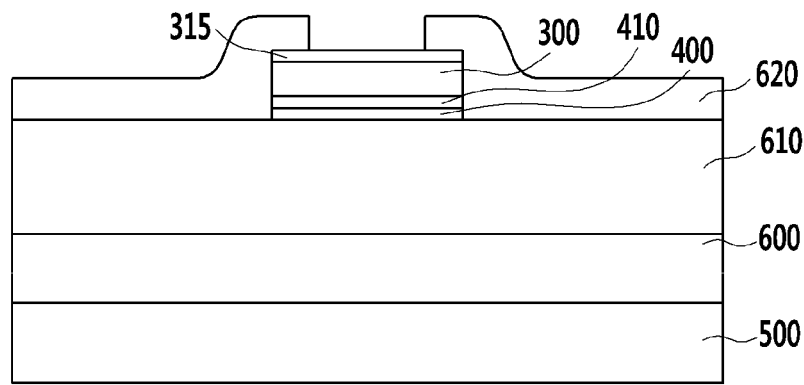

FIG. 6A is a view showing further details of a gate line pad part of embodiments of the invention, and FIG. 6B is a view showing further details of a data line pad part of embodiments of the invention.

The respective pad parts may have passivation opened in an outer lead bonding (OLB) area.

Since the corrosion prevention electrode 251 is formed in the double wiring on the gate line 200 in FIG. 6A and the corrosion prevention electrode 315 is formed in the double wiring on the data line 300 in FIG. 6B, the corrosion prevention layers may serve to prevent the metal layer from being exposed to the outside by the passivation open area.

The corrosion prevention electrodes 251 and 315 may be made of a transparent conductive oxide (TCO).

Figure 7A:
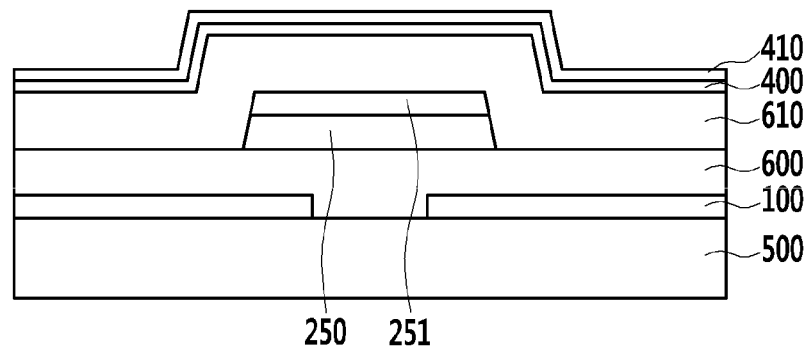
FIGS. 7A, 7B, and 7C are views illustrating a first operation of a manufacturing method of a liquid crystal display according to an exemplary embodiment of the present invention.
Figure 7B:
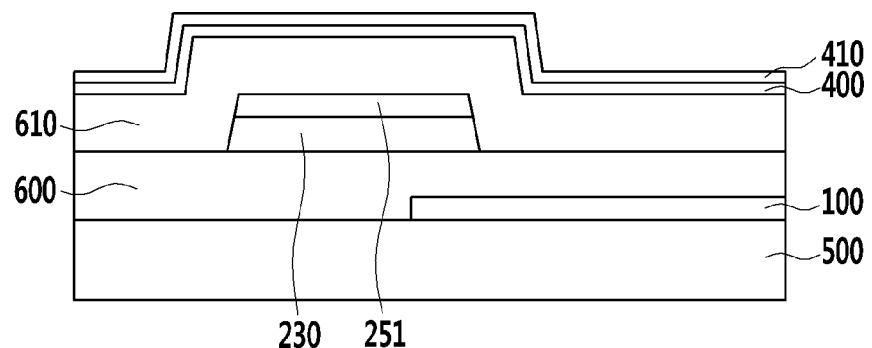
Figure 7C:
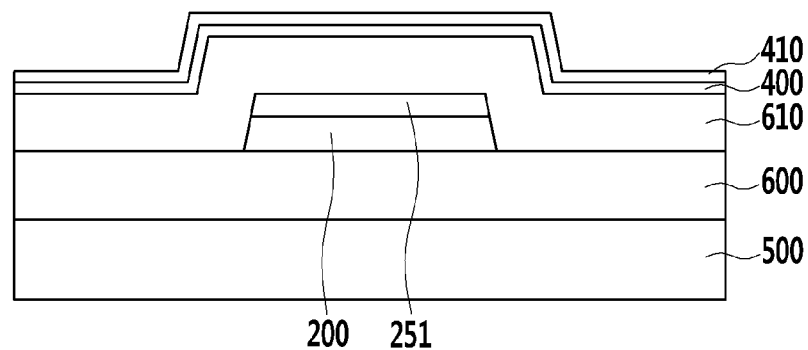

FIGS. 7A-C are views illustrating a first operation of a method of manufacturing a liquid crystal display according to an exemplary embodiment of the present invention. FIG. 7A is a view for describing a first operation of a manufacturing method of a data wiring part corresponding to FIG. 2, FIG. 7B is a view for describing a first operation of a manufacturing method of a transistor forming part corresponding to FIG. 4, and FIG. 7C is a view for describing a first operation of a manufacturing method of a contact area corresponding to FIG. 5.

Referring to FIGS. 7A, 7B, and 7C, the pixel electrode 100 is formed on the first substrate 500. The pixel electrode 100 may be made of a transparent conductive oxide (TCO) such as indium tin oxide (ITO).

The pixel electrode 100 may be patterned by mask processes including an application of photoresist, an exposure using a first mask, a development of the exposed photoresist, an etching, and the like, in known manner.

Thereafter, the first insulating layer 600 which may be made of an inorganic insulating material such as silicon nitride (SiNx), silicon oxide (SiOx), or the like is stacked.

Next, a metal layer which is made of a single material such as aluminum (Al), molybdenum (Mo), copper (Cu), or the like, a synthetic material, a stacked structure, or the like is deposited. In this case, the metal layer may further include the corrosion prevention layer 251 formed thereon, so as to have a double wiring form, although any number of layers of any suitable conductors is contemplated.

The above-mentioned metal layer is patterned by a mask process using a second mask, such that the sustain electrode line 250, the gate line 200, and the protrusion part 230 may be formed.

Thereafter, the second insulating layer 610 and the semiconductor 400 are sequentially stacked and the ohmic contact 410 is selectively stacked depending on a kind of semiconductor 400.

Figure 8A:
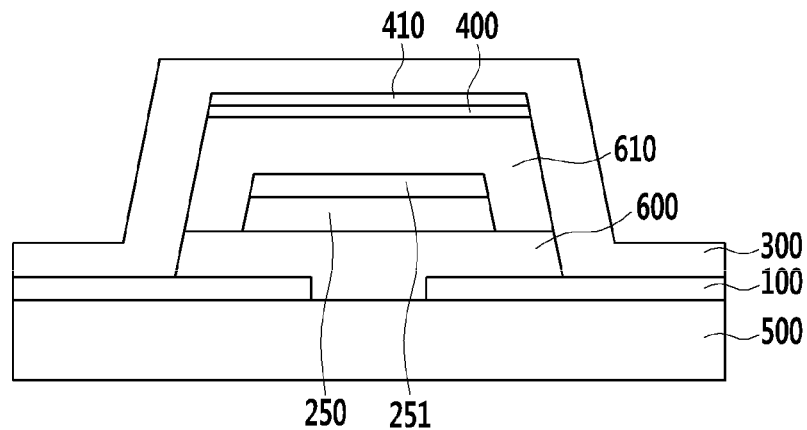
FIGS. 8A, 8B, and 8C are views illustrating a second operation of a manufacturing method of a liquid crystal display according to an exemplary embodiment of the present invention.
Figure 8B:
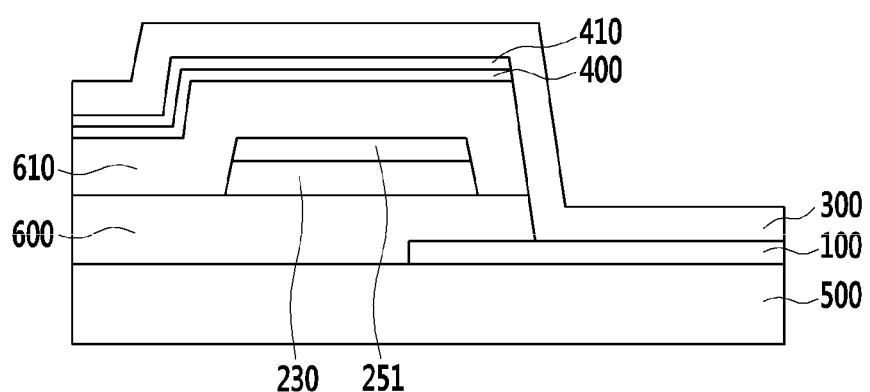
Figure 8C:
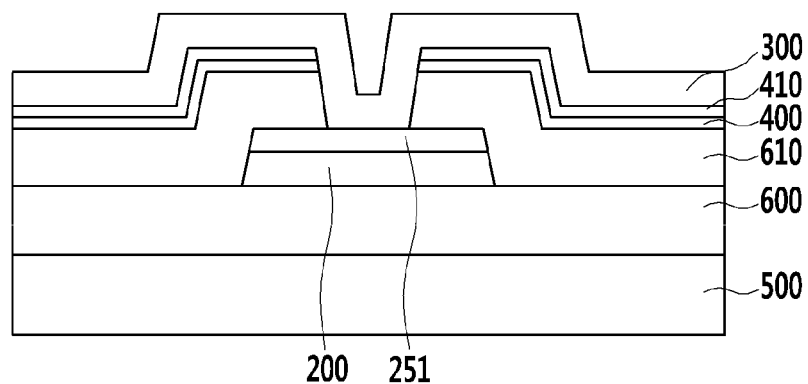

FIGS. 8A, 8B, and 8C are views illustrating a second operation of a manufacturing method of a liquid crystal display according to an exemplary embodiment of the present invention. FIG. 8A is a view illustrating a second operation of a manufacturing method of a data wiring part corresponding to FIG. 2, FIG. 8B is a view illustrating a second operation of a manufacturing method of a transistor forming part corresponding to FIG. 4, and FIG. 8C is a view illustrating a second operation of a manufacturing method of a contact area corresponding to FIG. 5.

Referring to FIGS. 8A, 8B, and 8C, the ohmic contact 410, the semiconductor 400, the second insulating layer 610, and the first insulating layer 600 are etched by a mask process using a third mask.

Hereinafter, although a case in which the third mask is a one-tone mask will be described, the third mask may alternatively be a two-tone mask. In the case in which the third mask is the two-tone mask, a fourth mask to be described below may be configured by the one-tone mask. The reason is that a process such as a selective etching of the semiconductor 400 and the ohmic contact 410 may be added by the third mask, which is the two-tone mask.

In etching an upper portion of the pixel electrode 100, if the etching is performed so that the display area DA of the pixel electrode 100 is exposed as a whole, the exemplary structures of FIG. 4 may be formed later and if the etching is performed so that only a contact area between the pixel electrode 100 and the drain electrode 320 is exposed, the exemplary structures of FIG. 4B may be formed later.

For convenience of explanation, FIG. 8B shows a form in which etching is performed so that the display area DA of the pixel electrode 100 is exposed as a whole, in order to form the exemplary structures of FIG. 4A later.

Next, a metal layer 300 which is made of a single material such as aluminum (Al), molybdenum (Mo), copper (Cu), or the like, a synthetic material, a stacked structure, or the like is deposited. In this case, the metal layer 300 may further include the corrosion prevention layer 315 formed thereon, so as to have a double wiring form.

Figure 9A:
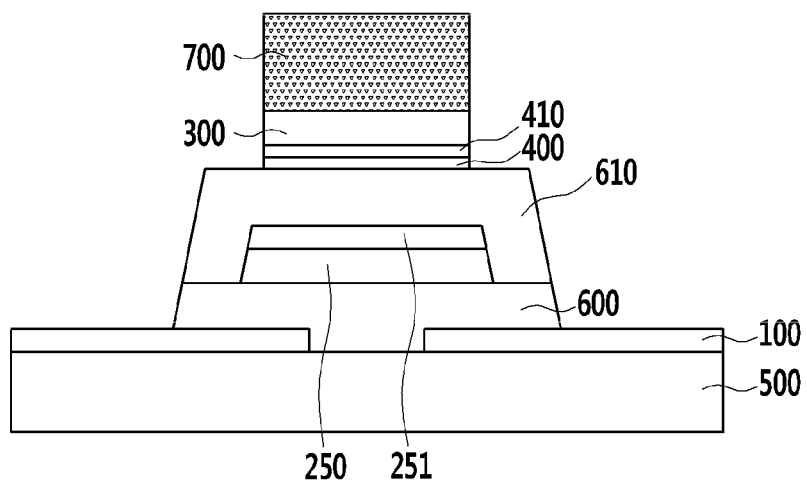
FIGS. 9A, 9B, and 9C are views illustrating a third operation of a manufacturing method of a liquid crystal display according to an exemplary embodiment of the present invention.
Figure 9B:
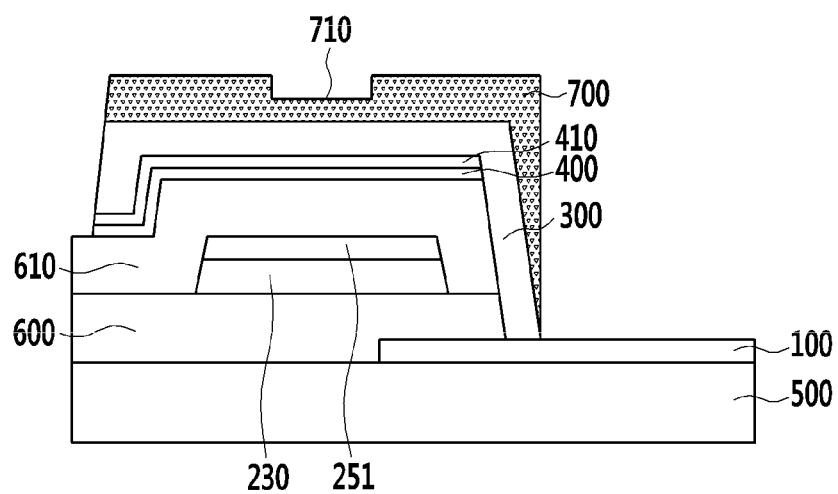
Figure 9C:
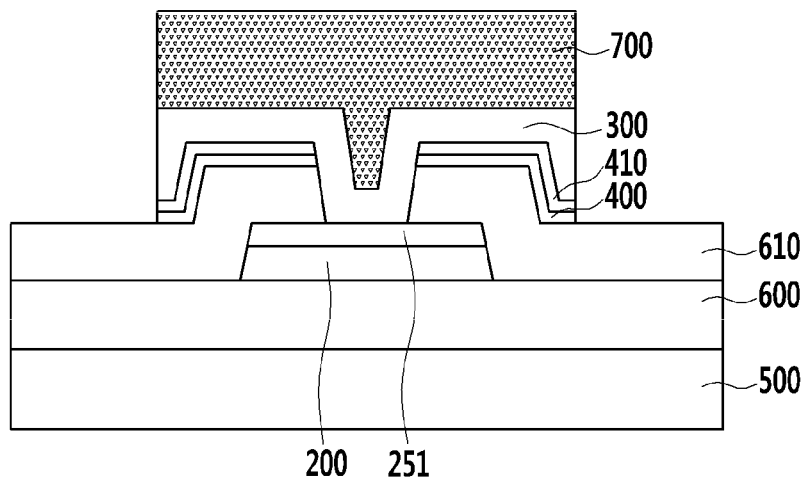

FIGS. 9A, 9B, and 9C are views illustrating a third operation of a manufacturing method for a liquid crystal display according to an exemplary embodiment of the present invention. FIG. 9A is a view illustrating a third operation of a manufacturing method of a data wiring part corresponding to FIG. 2, FIG. 9B is a view illustrating a third operation of a manufacturing method of a transistor forming part corresponding to FIG. 4, and FIG. 9C is a view illustrating a third operation of a manufacturing method of a contact area corresponding to FIG. 5.

Referring to FIGS. 9A, 9B, and 9C, processes of etching the metal layer 300, the ohmic contact 410, and the semiconductor 400 using a fourth mask, which is a two-tone mask, are shown.

The two-tone mask may be a half-tone mask and may include at least three parts (a light blocking area, a transflective area, and a light transmitting area) having different transmittances of light. The remaining portions after development may be different depending on whether the photoresist is a negative type or a positive type.

In FIGS. 9A, 9B, and 9C, the metal layer 300, the ohmic contact 410, and the semiconductor 400 may be sequentially etched in portions in which the developed photoresist 700 does not remain.

A recess part 710 of the photoresist 700 corresponding to the transflective area goes through ashing operation, such that the remaining photoresist 700 of the area corresponding to the recess part 710 may be removed.

Figure 10:
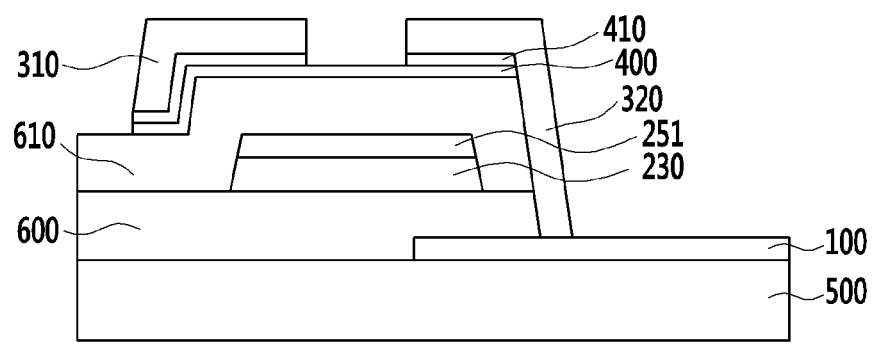
FIG. 10 is a view for describing a fourth operation of manufacturing a transistor forming part.

Referring to FIG. 10, a channel part of the thin film transistor is exposed through the area corresponding to the removed recess part 710, and the metal layer 300 and the ohmic contact 410 are sequentially etched, thereby forming the source electrode 310 and the drain electrode 320.

Thereafter, a third insulating layer 620 is stacked by a passivation process and the insulating layer 620 may be patterned by a fifth mask.

In this case, if the operation of FIG. 8B is performed so that the first insulating layer 600 and the second insulating layer 610 remain on the display area DA of the pixel electrode 100, the subsequent patterning operation may remove second insulating layer 610. By leaving the first insulating layer 600, an exposure of the pixel electrode 100 by a dry etching may be minimized (FIG. 4B).

The drawings and the detailed description of the present invention which are described above are merely illustrative, are just used for the purpose of describing the present invention, and are not used for qualifying the meaning or limiting the scope of the present invention, which is disclosed in the appended claims. Therefore, it will be appreciated to those skilled in the art that various modifications and are made and other equivalent embodiments are available. Accordingly, the actual technical protection scope of the present invention must be determined by the spirit of the appended claims. Furthermore, different features of the various embodiments, disclosed or otherwise understood, can be mixed and matched in any manner to produce further embodiments within the scope of the invention.

DESCRIPTION OF SYMBOLS

3: liquid crystal layer
100: pixel electrode
200: gate line
250: sustain electrode line
251: corrosion prevention electrode
300: data line
310: source electrode
320: drain electrode
400: semiconductor
410: ohmic contact
500: first substrate
600: first insulating layer
610: second insulating layer
620: third insulating layer
700: photoresist
710: recess part
800: second substrate
810: common electrode
820: light blocking member

What is claimed is:

1. A method of manufacturing a liquid crystal display, the method comprising:
forming a pixel electrode on a first substrate;
forming a first insulating layer on the pixel electrode;
forming a sustain electrode line and a gate line on the first insulating layer;
forming a second insulating layer on the sustain electrode line and the gate line;
forming a semiconductor layer on the second insulating layer;
etching parts of the semiconductor layer, the second insulating layer, and the first insulating layer so that a part of the pixel electrode is exposed; and
forming a source electrode, a drain electrode, and a data line by depositing a conductive material on the second insulating layer and subsequently etching the conductive material,
wherein the first insulating layer is disposed between the pixel electrode and the sustain electrode line.

2. The method of claim 1, wherein:
the part of the pixel electrode is a part corresponding to a display area of the pixel electrode.

3. The method of claim 1, wherein:
the part of the pixel electrode contacts the drain electrode.

4. The method of claim 3, further comprising:
forming a third insulating layer,
wherein in the forming a third insulating layer, the second insulating layer is etched in an area corresponding to a display area of the pixel electrode.

5. The method of claim 1, further comprising:
after the forming a semiconductor layer, forming an ohmic contact.

6. The method of claim 5, further comprising:
forming a third insulating layer,
wherein the forming of a pixel electrode includes forming the pixel electrode using a first mask,
wherein the forming a sustain electrode line and a gate line is performed using a second mask,
wherein the etching parts of the semiconductor layer, the second insulating layer, and the first insulating layer is performed so as to expose the part of the pixel electrode using a third mask,
wherein the forming a source electrode, a drain electrode, and a data line is performed using a fourth mask, and
wherein the forming a third insulating layer is performed using a fifth mask.

7. The method of claim 6, wherein:
the third mask is a two-tone mask.

8. The method of claim 6, wherein:
the fourth mask is a two-tone mask.

* * * * *